United States Patent
Kurihara

(10) Patent No.: US 10,332,656 B2
(45) Date of Patent: Jun. 25, 2019

(54) OXIDE SUPERCONDUCTING WIRE

(71) Applicant: FUJIKURA LTD., Tokyo (JP)

(72) Inventor: Chihaya Kurihara, Sakura (JP)

(73) Assignee: FUJIKURA LTD., Tokyo (JP)

( * ) Notice: Subject to any disclaimer, the term of this patent is extended or adjusted under 35 U.S.C. 154(b) by 335 days.

(21) Appl. No.: 15/507,167

(22) PCT Filed: Sep. 23, 2016

(86) PCT No.: PCT/JP2016/078089
§ 371 (c)(1),
(2) Date: Feb. 27, 2017

(87) PCT Pub. No.: WO2017/077788
PCT Pub. Date: May 11, 2017

(65) Prior Publication Data
US 2017/0287599 A1 Oct. 5, 2017

(30) Foreign Application Priority Data

Nov. 6, 2015 (JP) .................................. 2015-218911

(51) Int. Cl.
*H01F 6/06* (2006.01)
*H01B 12/06* (2006.01)
(Continued)

(52) U.S. Cl.
CPC .............. *H01B 12/06* (2013.01); *C01G 3/006* (2013.01); *C23C 14/08* (2013.01); *C23C 14/081* (2013.01);
(Continued)

(58) Field of Classification Search
None
See application file for complete search history.

(56) References Cited

U.S. PATENT DOCUMENTS

2007/0145100 A1* 6/2007 Suzuki ................ H01L 39/143
228/101
2012/0015818 A1 1/2012 Schlenga et al.
(Continued)

FOREIGN PATENT DOCUMENTS

CN 102376869 A 3/2012
CN 102484198 A 5/2012
(Continued)

OTHER PUBLICATIONS

Office Action issued in corresponding Chinese Application No. 201680002391.8 dated Apr. 3, 2018 (5 pages).
Notice of Allowance in counterpart Japanese Patent Application No. 2017-506937 dated Aug. 1, 2017 (3 pages).

*Primary Examiner* — Colleen P Dunn
(74) *Attorney, Agent, or Firm* — Osha Liang LLP

(57) ABSTRACT

An oxide superconducting wire, includes a laminate including a base material, an intermediate layer, and an oxide superconducting layer, the intermediate layer being laminated on a main surface of the base material, the intermediate layer being constituted of one or more layers having an orientation, the intermediate layer having one or more first non-orientation regions extending in a longitudinal direction of the base material, the oxide superconducting layer being laminated on the intermediate layer, the oxide superconducting layer having a crystal orientation controlled by the intermediate layer, the oxide superconducting layer having second non-orientation regions located on the first non-orientation regions, and a metal layer which covers at least a front surface and side surfaces of the oxide superconducting layer in the laminate.

8 Claims, 5 Drawing Sheets

(51) Int. Cl.
  *H01L 39/14* (2006.01)
  *H01L 39/24* (2006.01)
  *C01G 3/00* (2006.01)
  *C25D 3/38* (2006.01)
  *C25D 7/06* (2006.01)
  *C23C 14/08* (2006.01)
  *C23C 14/18* (2006.01)
  *C23C 14/22* (2006.01)
  *C23C 14/46* (2006.01)
(52) U.S. Cl.
  CPC ............ *C23C 14/082* (2013.01); *C23C 14/18* (2013.01); *C23C 14/221* (2013.01); *C23C 14/46* (2013.01); *C25D 3/38* (2013.01); *C25D 7/0607* (2013.01); *H01F 6/06* (2013.01); *H01L 39/143* (2013.01); *H01L 39/2461* (2013.01); *C01P 2006/40* (2013.01)

(56) References Cited

U.S. PATENT DOCUMENTS

| | | |
|---|---|---|
| 2012/0181062 A1 | 7/2012 | Neumuller et al. |
| 2013/0137579 A1 | 5/2013 | Nagasu et al. |
| 2013/0137580 A1 | 5/2013 | Hayase et al. |
| 2014/0031236 A1* | 1/2014 | Araki ............... C04B 35/4508 505/237 |

FOREIGN PATENT DOCUMENTS

| | | |
|---|---|---|
| CN | 103069509 A | 4/2013 |
| CN | 103069511 A | 4/2013 |
| EP | 2495735 A1 | 9/2012 |
| JP | 2005079351 A | 3/2005 |
| JP | 2007141688 A | 6/2007 |
| JP | 2011096566 A | 5/2011 |
| JP | 2013201014 A | 10/2013 |

* cited by examiner

OXIDE SUPERCONDUCTING WIRE

TECHNICAL FIELD

The present invention relates to an oxide superconducting wire.

Priority is claimed on Japanese Patent Application No. 2015-218911, filed Nov. 6, 2015, the content of which is incorporated herein by reference.

BACKGROUND ART

RE-123-based oxide superconductors ($REBa_2Cu_3O_{7-x}$: RE represents rare earth elements including Y) exhibit superconductivity at the temperature of liquid nitrogen and have low current losses and are thus extremely promising materials in a practical sense, and there is demand for RE-123-based oxide superconductors to be processed into wires and be used as conductors or electromagnetic coils for power supply and the like.

As an example of the structure of RE-123-based oxide superconducting wires, oxide superconducting wires obtained by using a base material made of a metal having a high mechanical strength, forming an intermediate layer having a favorable crystal orientation on the surface of the base material using an ion-beam-assisted deposition method (IBAD method), forming an oxide superconducting layer on the surface of the intermediate layer using a film-forming method, and forming a metal-stabilizing layer constituted of a highly conductive material such as Ag on the surface of the oxide superconducting layer are known.

When a magnetic field component, which varies in a direction perpendicular to the surface over time, is applied to an oxide superconducting wire, loop-like shielding currents flow in the surface of an oxide superconducting layer. The shielding currents cause magnetization losses that are discharged in a heat form. Therefore, when large shielding currents are generated, there has been a problem in that the energy efficiency of oxide superconducting wires decreases. In addition, when an oxide superconducting wire is processed into a coil shape and is supplied with currents so as to generate a magnetic field, the magnetic field is shielded due to shielding currents, and there has been a problem in that the magnetic field cannot be generated as designed.

In addition, shielding currents attenuate over time. Therefore, in a case in which an oxide superconducting wire is applied to a superconducting device generating a magnetostatic field which does not change over time, there has been a problem in that magnetic fields change over time due to the attenuation of shielding currents.

Shielding currents and the degrees of magnetization losses caused by the shielding currents depend on the width of the oxide superconducting layer. Therefore, when oxide superconducting wires are thinned, it is possible to reduce the shielding currents and the magnetization losses. In addition, in a case in which oxide superconducting wires are used in devices to which alternating-currents are applied such as motors or transformers, it is possible to reduce alternating-current losses caused by magnetic fields generated on the basis of flowing alternating-currents by thinning the oxide superconducting wires.

Patent Documents 1 and 2 disclose oxide superconducting wires thinned by dividing an oxide superconducting layer into a plurality of fragments.

PRIOR ART DOCUMENTS

Patent Documents

[Patent Document 1] Japanese Unexamined Patent Application, First Publication No. 2007-141688

[Patent Document 2] Japanese Unexamined Patent Application, First Publication No. 2011-96566

SUMMARY OF THE INVENTION

Problems to be Solved by the Invention

However, in the oxide superconducting wires described in Patent Documents 1 and 2, there have been the following problems.

(1) In the thinned oxide superconducting layer, in a case in which defects are generated, the influence of the defects becomes significant, and thus it is likely that quenches may occur by even small defects.

(2) When grooves for dividing the oxide superconducting layer into a plurality of fragments are formed, there are cases in which the substrate is damaged and the strength of the wires decreases.

(3) There are cases in which the side surface of the oxide superconducting layer comes into contact with moisture and thus the oxide superconducting layer deteriorates.

(4) Since not only the oxide superconducting layer but also the stabilizing layer are divided, the current-bypassing function of the stabilizing layer disappears, and quenches are likely to occur.

The present invention has been made in consideration of the above-described problem, and an object of the present invention is to provide an oxide superconducting wire which does not degrade the characteristics of the oxide superconducting wire, prevents quenches, increases the strength of wires, and furthermore, is not easily deteriorated.

Means for Solving the Problems

In order to solve the above-described problems, an oxide superconducting wire according to a first aspect of the present invention includes a laminate including a base material, an intermediate layer, and an oxide superconducting layer, the intermediate layer being laminated on a main surface of the base material, the intermediate layer being constituted of one or more layers having an orientation, the intermediate layer having one or more first non-orientation regions extending in a longitudinal direction of the base material, the oxide superconducting layer being laminated on the intermediate layer, the oxide superconducting layer having a crystal orientation controlled by the intermediate layer, the oxide superconducting layer having second non-orientation regions located on the first non-orientation regions, and a metal layer which covers at least a front surface and side surfaces of the oxide superconducting layer in the laminate.

According to the constitution of the above-described aspect, the following effects are exhibited.

(1) When the oxide superconducting layer is transited from the superconducting state to the normal conduction state, the metal layer is capable of functioning as a bypass for commutating currents in the oxide superconducting layer. Therefore, even in a case in which filaments formed by means of division are thin, in a case in which there are local defects, it is possible to limit the adverse influence of defects and prevent quenches.

(2) Since the metal layer is formed, a decrease in the mechanical strength of the base material caused by groove portions is complemented, and it is possible to increase the mechanical strength of the oxide superconducting wire.

(3) Since the formation of the metal layer in the oxide superconducting wire prevents the oxide superconducting layer from being exposed, it is possible to prevent the oxide superconducting layer from deteriorating due to moisture that has intruded into the oxide superconducting wire from the outside.

(4) Since the metal layer functions as a bypass for commutating currents in the oxide superconducting layer, even when the oxide superconducting wire is divided into a plurality of filaments, it is possible to reliably prevent quenches by enhancing the current-bypassing function.

The main surface of the base material or the main surface of any one layer in the intermediate layer has orientation inhibition regions, and the orientation inhibition regions may be regions that inhibit crystal orientations in layers laminated on the orientation inhibition regions and form the first non-orientation regions and the second non-orientation regions.

According to the constitution of the above-described aspect, the non-orientation regions can be formed on layers over the orientation inhibition regions by forming the orientation inhibition regions. Therefore, it is not necessary to carry out direct processing after the lamination of the oxide superconducting layer, and there are no cases in which characteristics deteriorate in regions other than the non-orientation regions in the oxide superconducting wire.

The orientation inhibition regions may be recessed groove portions formed on the main surface of the base material or the main surface of any one layer in the intermediate layer.

According to the constitution of the above-described aspect, the oxide superconducting wire can be easily thinned by forming the recessed groove portions in the base material or the intermediate layer.

The intermediate layer may include a textured layer and a cap layer laminated on the textured layer, the oxide superconducting layer may be laminated on the cap layer, and the recessed groove portions may be covered with the cap layer.

According to the constitution of the above-described aspect, it is possible to suppress the diffusion of a metallic material of the base material into the oxide superconducting layer using the cap layer by covering the recessed groove portions with the cap layer. The presence of the cap layer enables the suppression of deterioration in the characteristics of the oxide superconducting layer.

The laminate may have the metal-stabilizing layer laminated on the oxide superconducting layer, and the metal layer may be formed so as to cover the metal-stabilizing layer.

According to the constitution of the above-described aspect, the metal-stabilizing layer functions as a bypass for commutating currents in the oxide superconducting layer together with the metal layer when the oxide superconducting layer is transited from the superconducting state to the normal conduction state. Therefore, it is possible to enhance the effect of preventing quenches.

Effects of Invention

Since the oxide superconducting wire according to the above-described aspect has the metal layer, the following effects are exhibited.

(1) The metal layer is capable of functioning as a bypass for commutating currents in the oxide superconducting layer when the oxide superconducting layer is transited from the superconducting state to the normal conduction state. Therefore, even in a case in which filaments formed by means of division are thin, in a case in which there are local defects, it is possible to limit the adverse influence of defects and prevent quenches.

(2) Since the metal layer is formed, a decrease in the mechanical strength of the base material caused by groove portions is complemented, and it is possible to increase the mechanical strength of the oxide superconducting wire.

(3) Since the formation of the metal layer in the oxide superconducting wire prevents the oxide superconducting layer from being exposed, it is possible to prevent the oxide superconducting layer from deteriorating due to moisture that has intruded into the oxide superconducting wire from the outside.

(4) Since the metal layer functions as a bypass for commutating currents in the oxide superconducting layer, even when the oxide superconducting wire is divided into a plurality of filaments, it is possible to reliably prevent quenches by enhancing the current-bypassing function.

EMBODIMENTS FOR CARRYING OUT THE INVENTION

Figure 1:
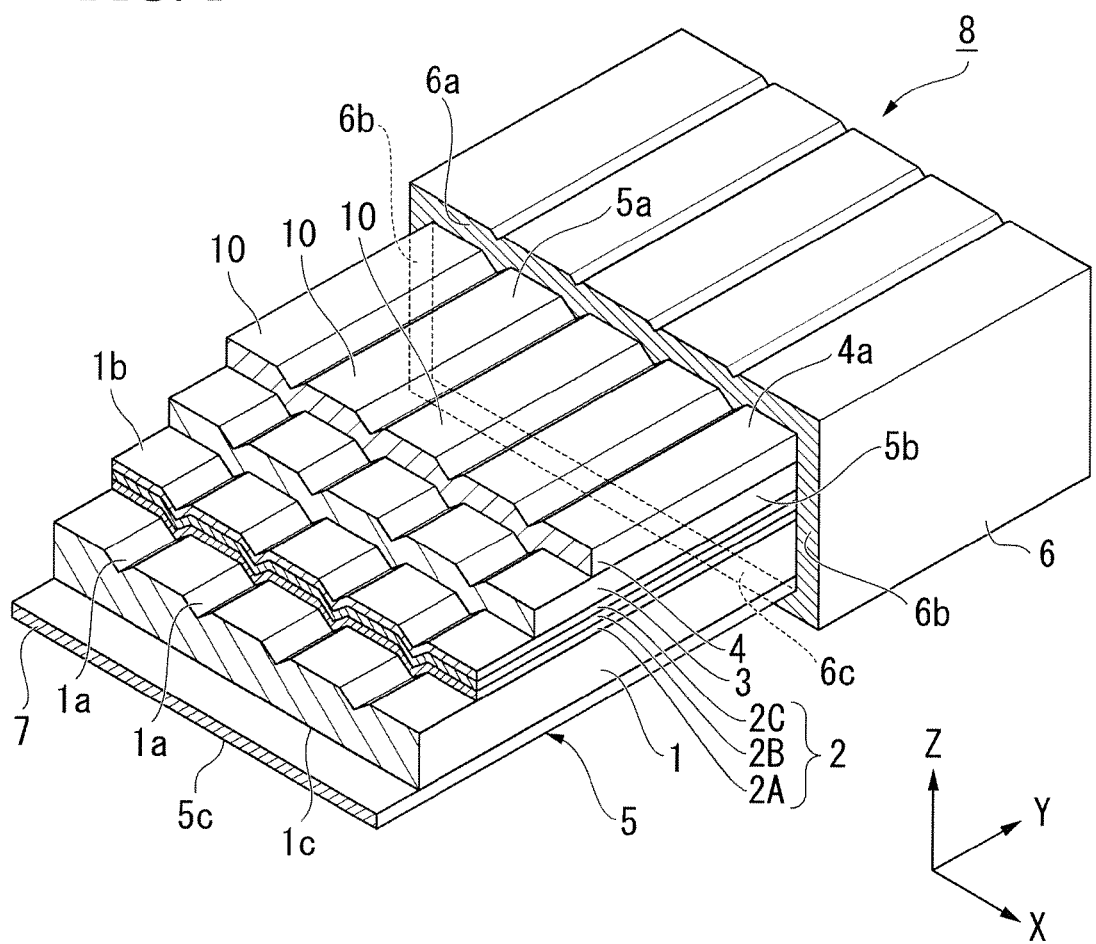
FIG. 1 is a sectional perspective view schematically showing an oxide superconducting wire according to a first embodiment.

Hereinafter, embodiments of an oxide superconducting wire according to the present invention will be described on the basis of the drawings. In the drawings used in the following description, there are cases in which characteristic portions are shown in an enlarged manner for convenience in order for the easier understanding of the characteristics, and the size ratios and the like of individual constituent elements are not always the same as those in actual cases. In addition, the present invention is not limited to the following embodiments.

In the following description, the XYZ orthogonal coordinate system will be employed. The Y direction is the longitudinal direction of a wire. The X direction is a direction orthogonal to the Y direction in the surface of the wire and is the width direction of the wire. The Z direction is a direction orthogonal to the X direction and the Y direction and is the thickness direction of the wire.

<First Embodiment>

Figure 2A:
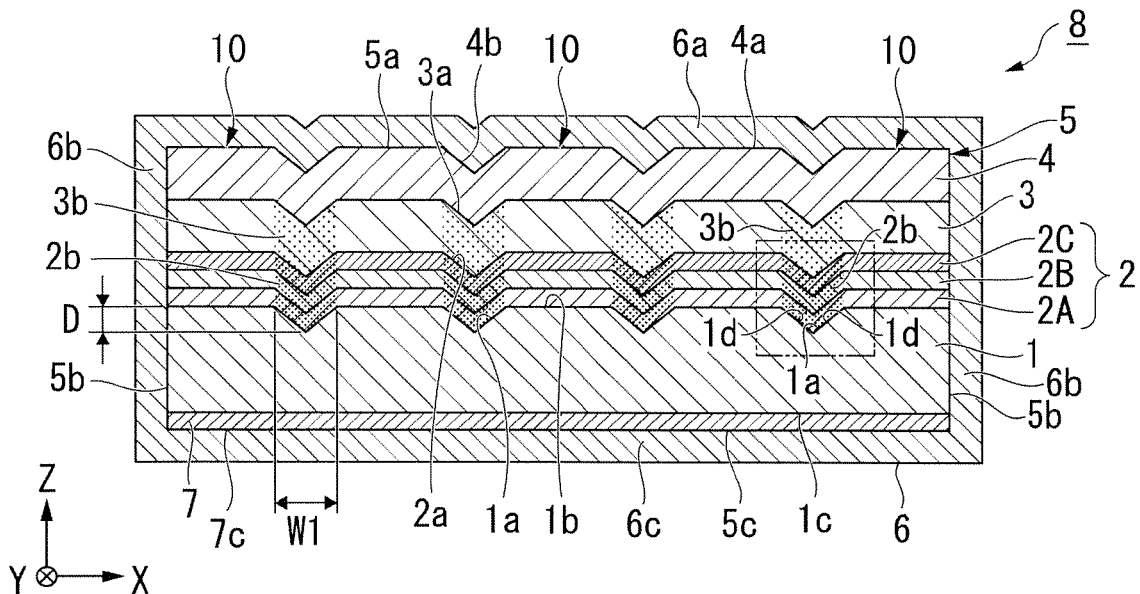
FIG. 2A is a sectional view schematically showing the oxide superconducting wire according to the first embodiment.
Figure 2B:
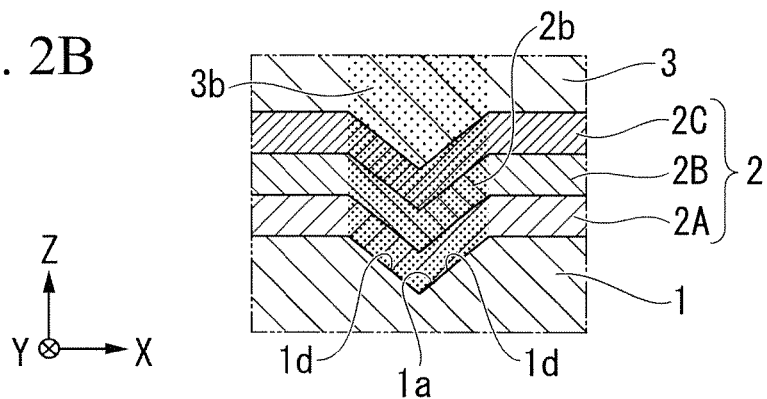
FIG. 2B is a sectional enlarged view schematically showing the oxide superconducting wire according to the first embodiment.

FIG. 1 shows a sectional perspective view of an oxide superconducting wire 8 according to the present embodiment. FIG. 2A shows a horizontal sectional schematic view of the oxide superconducting wire 8 according to the present embodiment. FIG. 2B shows a sectional enlarged view of the oxide superconducting wire 8 according to the present embodiment.

As shown in FIGS. 1, 2A, and 2B, the oxide superconducting wire 8 according to the present embodiment has a laminate 5 and a metal layer 6 formed at the outer circumference of the laminate 5.

The laminate 5 is constituted by laminating an intermediate layer 2, an oxide superconducting layer 3, and a metal-stabilizing layer 4 (first metal-stabilizing layer) in this order on a main surface 1b (first surface) of a base material 1 and forming a foundation layer (base material foundation layer) 7 on a rear surface 1c (second surface) of the base material 1. In other words, in the laminate 5, the base material 1 is formed on the foundation layer 7, the intermediate layer 2 is formed on the base material 1, the oxide superconducting layer 3 is formed on the intermediate layer 2, and the metal-stabilizing layer 4 is formed on the oxide superconducting layer 3.

On the main surface 1b of the base material 1, a plurality of first recessed groove portions 1a disposed in parallel at intervals are formed. These first recessed groove portions 1a function as orientation inhibition regions. The orientation inhibition regions inhibit the orientations of the intermediate layer 2 and the oxide superconducting layer 3 formed on the first recessed groove portion 1a, whereby non-orientation regions (first non-orientation regions) 2b are formed in the intermediate layer 2 on the first recessed groove portions 1a, and non-orientation regions (second non-orientation regions) 3b are formed in the oxide superconducting layer 3.

Since the non-orientation regions 3b in the oxide superconducting layer 3 do not have superconducting characteristics, the non-orientation regions serve as high-resistance regions when used and do not easily allow the flow of currents. Therefore, the oxide superconducting layer 3 is substantially fragmented and thinned. Therefore, the oxide superconducting wire 8 has a constitution which is divided into a plurality of parallel filaments 10 due to the fragmentation and thinning by the non-orientation regions 3b.

In the present specification, the non-orientation region refers to a region exhibiting no orientations in a layer including regions in which crystals exhibit orientations. In addition, the orientation inhibition region refers to a region inhibiting the crystal orientation of a layer laminated on the orientation inhibition region. In a case in which another layer is laminated on the orientation inhibition region, the orientation inhibition region also inhibits the orientation of a layer laminated with said another layer interposed therebetween (for example, a layer laminated on said another layer).

Hereinafter, the constitutions of the respective portions will be described in detail.

The base material 1 is a material that can be used as a base material for superconducting wires and is preferably a material constituted of a heat-resistant metal. Among heat-resistant metals, the base material 1 is preferably an alloy and more preferably a nickel (Ni) alloy or a copper (Cu) alloy. Among these, as commercially available products, HASTELLOY (trade name, manufactured by Haynes International, Inc.) is preferred, and all types of HASTELLOY B, C, G, N, W, and the like in which the amounts of components such as molybdenum (Mo), chromium (Cr), iron (Fe), and cobalt (Co) vary can also be used. In addition, as the base material 1, an orientation substrate having aligned orientations of metallic crystals may be used.

In the present embodiment, the shape of the base material 1 is a long tape shape, but may be, for example, a sheet shape. The thickness of the base material 1 may be appropriately adjusted depending on the intended purpose and can be in a range of 10 to 500 μm.

On the main surface 1b of the base material 1, a plurality of first recessed groove portions (orientation inhibition regions) 1a are formed.

The first recessed groove portions 1a are grooves formed on the main surface 1b of the base material 1 and linearly extend in the longitudinal direction of the base material 1. A plurality of the first recessed groove portions 1a are formed parallel to each other at intervals.

As shown in FIGS. 2A and 2B, the first recessed groove portion 1a is a groove which has a pair of facing inclined inside surfaces 1d and 1d and a V-shaped section. The inclined inside surfaces 1d and 1d are inclined inside with respect to the Z direction (the thickness direction of the oxide superconducting wire 8) in the groove depth direction.

The inside mentioned herein refers to a direction in which one inclined inside surface (a first inclined inside surface) 1d comes closer to the other inclined inside surface (a second inclined inside surface) 1d.

The depth D of the first recessed groove portion 1a is preferably 0.3 μm or more and 10 μm or less, and the width W1 thereof is preferably 10 μm or more and 500 μm or less.

When the depths D of the first recessed groove portions 1a are 0.3 μm or more, it is possible to form the non-orientation regions 2b in the intermediate layer 2 in portions formed on the first recessed groove portions 1a. In addition, when the depths D of the first recessed groove portions 1a are 10 μm or less, it is possible to maintain the strength of the base material 1.

When the widths W1 of the first recessed groove portions 1a are 10 μm or more, it is possible to form the non-orientation regions 2b having a sufficient width. In addition, when the widths W1 of the first recessed groove portions 1a are 500 μm or less, it is possible to narrow the widths of the non-orientation regions 3b in the oxide superconducting layer 3 and ensure the critical current of the entire wire.

In the present embodiment, the first recessed groove portions 1a are V-shaped grooves, but the shape of the first recessed groove portion 1a is not limited to the V shape, and the shape of the first recessed groove portion 1a is not limited as long as the shape allows the non-orientation regions 2b to be formed in the intermediate layer 2.

The intermediate layer 2 is formed on the main surface 1b of the base material 1. To the intermediate layer 2, it is possible to apply a structure in which a foundation layer 2A, a textured layer 2B, and a cap layer 2C are laminated in this order. In other words, it is possible to apply a structure in which the foundation layer 2A is formed on the base material 1, the textured layer 2B is formed on the foundation layer 2A, and the cap layer 2C is formed on the textured layer 2B.

The foundation layer 2A is constituted of at least one of a diffusion prevention layer and a bed layer.

The diffusion prevention layer has a function of suppressing the diffusion of some of the constituent elements of the base material 1 and the incorporation of the constituent elements into the oxide superconducting layer 3 as impurities in a case in which other layers are formed on surfaces over the diffusion prevention layer by a heating treatment and, consequently, the base material 1 or other layers are affected by a thermal hysteresis. The diffusion prevention layer is constituted of $Si_3N_4$, $Al_2O_3$, GZO ($Gd_2Zr_2O_7$), or the like and is formed to, for example, a thickness of 10 to 400 nm.

The bed layer is provided in order to suppress reactions of the constituent elements in the interface between the base material 1 and the oxide superconducting layer 3 and improve the orientations of layers provided on surfaces over the bed layer. The bed layer is a layer for reducing interface reactivity and obtaining the orientations of films formed on the bed layer and is constituted of $Y_2O_3$, $Er_2O_3$, $CeO_2$, $Dy_2O_3$, $Er_2O_3$, $Eu_2O_3$, $Ho_2O_3$, $La_2O_3$, or the like. The thickness of the bed layer is, for example, 10 to 100 nm.

The textured layer 2B is provided in order to control the crystal orientation of the cap layer 2C formed on the textured layer 2B or the oxide superconducting layer 3. The textured layer 2B is formed of a biaxially textured substance in order to control the crystal orientation of the cap layer 2C formed on the textured layer 2B. Examples of a material of the textured layer 2B include metallic oxides such as $Gd_2Zr_2O_7$, MgO, $ZrO_2$—$Y_2O_3$ (YSZ), $SrTiO_3$, $CeO_2$, $Y_2O_3$, $Al_2O_3$, $Gd_2O_3$, $Zr_2O_3$, $Ho_2O_3$, and $Nd_2O_3$. The textured layer 2B is preferably formed using an ion-beam-assisted deposition (IBAD) method.

The cap layer 2C is provided in order to control the crystal orientation of the oxide superconducting layer 3 to an extent that is as strong as or stronger than that of the textured layer 2B. The cap layer 2C is constituted of a material that can be formed into a film on the surface of the textured layer 2B and allows crystal grains to be self-epitaxy in the in-plane direction. Specifically, the cap layer 2C is constituted of $CeO_2$, $Y_2O_3$, $Al_2O_3$, $Gd_2O_3$, $ZrO_2$, YSZ, $Ho_2O_3$, $Nd_2O_3$, $LaMnO_3$, or the like. The film thickness of the cap layer 2C can be formed in a range of 50 to 5000 nm. The cap layer may be constituted of a plurality of layers.

In the intermediate layer 2, particularly, the textured layer 2B and the cap layer 2C are provided in order to control the orientation of the oxide superconducting layer 3 formed on the intermediate layer 2. When the textured layer 2B and the cap layer 2C have orientations, it is possible to control the orientation of the oxide superconducting layer 3 formed on the intermediate layer 2. Therefore, in a case in which the textured layer 2B and the cap layer 2C do not have any orientation, the oxide superconducting layer 3 formed on the intermediate layer 2 is also not capable of having an orientation.

The orientation of the intermediate layer 2 relies on the surface properties (the characteristics of the surface) of the main surface 1b of the base material 1 on which the intermediate layer 2 is laminated.

In a case in which the surface of the main surface 1b is inclined or the surface of the main surface 1b is coarse, the growth directions of crystals in the intermediate layer 2 are disarrayed, and the intermediate layer 2 does not become a layer having a preferred orientation as a foundation for the oxide superconducting layer 3.

In the present embodiment, since the first recessed groove portions 1a are formed on the main surface 1b of the base material 1, and inclined surfaces are formed on the surface on which a film is to be formed, the orientations in portions of the intermediate layer 2 which are formed on the first recessed groove portions 1a are disarrayed. Due to the disarray of the orientations in portions of the intermediate layer 2 formed on the first recessed groove portions 1a, the non-orientation regions 2b corresponding to the first recessed groove portions 1a are formed in portions formed on the first recessed groove portions 1a of the base material 1 in the intermediate layer 2. In addition, in portions of the intermediate layer 2 formed on the first recessed groove portions 1a, the second recessed groove portions 2a are formed on the surfaces of the first recessed groove portions 1a as if the first recessed groove portions 1a are transferred. The second recessed groove portions 2a are, similar to the first recessed groove portions a, V-shaped grooves.

In a case in which the depths D of the first recessed groove portions 1a in the base material 1 are shallow with respect to the thickness of the intermediate layer 2, there are cases in which the first recessed groove portions 1a are implanted by the lamination of the intermediate layer 2 and the second recessed groove portions 2a are not formed on the surface of the intermediate layer 2. Even in a case in which the second recessed groove portions 2a are not formed, the non-orientation regions 3b can be formed in the oxide superconducting layer 3 as long as the non-orientation regions 2b are formed on the surface of the intermediate layer 2.

Examples of a material constituting the oxide superconducting layer 3 include well-known materials, and specifically, $REBa_2Cu_3O_{7-x}$ (RE represents one or more of Sc, Y, La, Ce, Pr, Nd, Pm, Sm, Eu, Gd, Tb, Dy, Ho, Er, Tm, Yb, and Lu which are rare earth elements) that is referred to as RE-123-based oxide superconductors can be exemplified. As the oxide superconducting layer 3, Y123 ($YBa_2CH_3O_{7-x}$), Gd123 ($GdBa_2Cu_3O_{7-x}$), and the like can be exemplified.

The thickness of the oxide superconducting layer 3 is approximately 0.5 to 5 μm and is preferably a uniform thickness.

In the oxide superconducting layer 3, portions formed on the non-orientation regions 2b in the intermediate layer 2 serve as the non-orientation regions 3b in which the orientations of crystals are disarrayed. In addition, in the non-orientation regions 3b, the third recessed groove portions 3a are formed as if the second recessed groove portions 2a in the intermediate layer 2 are transferred.

The orientation of the oxide superconducting layer 3 is controlled by the intermediate layer 2 (particularly, the textured layer 2B and the cap layer 2C). Therefore, the portions formed on the non-orientation regions 2b in the intermediate layer 2 do not have enough of a crystal orientation to develop a superconducting state.

Additionally, on the surfaces of the non-orientation regions 2b in the intermediate layer 2, the linear second recessed groove portions 2a which are V-shaped grooves are formed. The orientation of the oxide superconducting layer 3 relies not only on the orientation of the intermediate layer 2 but also on the surface properties of the intermediate layer 2. When the second recessed groove portions 2a are formed on the non-orientation regions 2b in the intermediate layer 2 as described above, it becomes more difficult for crystals constituting the oxide superconducting layer 3 formed on the second recessed groove portions 2a to be oriented. Even in a case in which the second recessed groove portions 2a are not formed on the surface of the intermediate layer 2, the non-orientation regions 3b are also formed in portions of the oxide superconducting layer 3 that are formed on the non-orientation regions 2b as long as the non-orientation regions 2b are formed. However, the presence of the second recessed groove portions 2a makes the non-orientations of the non-orientation regions 3b in the oxide superconducting layer 3 more significant.

When the orientation is disarrayed, the non-orientation regions 3b do not have superconducting characteristics or have a significantly low critical current. Therefore, when currents are made to flow in the oxide superconducting wire 8 at an extremely low temperature, the currents do not easily flow through the non-orientation regions 3b, and the oxide superconducting layer 3 is substantially fragmented.

When the oxide superconducting layer 3 is partitioned in the width direction by the non-orientation regions 3b, the oxide superconducting layer 3 functions as a plurality of superconducting wires thinned by the non-orientation regions 3b.

The non-orientation region 3b may not be formed throughout the entire portion on each second recessed groove portion 2a as long as the non-orientation regions 3b are formed so as to partition the oxide superconducting layer 3 in the width direction. That is, the width of the non-orientation region 3b may be partially wide or narrow as long as the non-orientation region 3b is capable of inhibiting currents flowing between portions of the highly-oriented oxide superconducting layer 3 which are adjacent to each other with the non-orientation region 3b therebetween.

The metal-stabilizing layer (protective layer) 4 is formed of a material having a favorable conductivity such as Ag or an Ag alloy and is foliated as a layer having a low contact resistance and a favorable affinity to the oxide superconducting layer 3. The metal-stabilizing layer 4 is laminated using a film-forming method such as a sputtering method, and the thickness of the metal-stabilizing layer 4 is approximately 1 to 30 µm.

Fourth recessed groove portions 4b are formed on a surface (main surface 4a) of the metal-stabilizing layer 4 as if the third recessed groove portions 3a in the oxide superconducting layer 3 are transferred. The main surface 4a is a surface on the oxide superconducting layer 3 side among the surfaces of the laminate 5.

The metal-stabilizing layer may be provided on a side surface 5b and a rear surface 5c of the laminate 5.

In a case in which the metal-stabilizing layer is provided on the side surface 5b of the laminate 5, the metal-stabilizing layer is preferably formed so as to cover at least a region from the side surface of the oxide superconducting layer 3 to the side surface of the base material 1.

The foundation layer 7 is formed of copper, a copper alloy, silver, a silver alloy, or the like. The thickness of the foundation layer 7 is, for example, 0.1 to 10 µm. The foundation layer 7 can be formed using a sputtering method or the like. The foundation layer 7 is capable of enhancing the adhesiveness of the metal layer 6 to the laminate 5.

The metal layer 6 (second metal-stabilizing layer) is formed so as to cover at least a main surface 5a (the main surface 4a of the metal-stabilizing layer 4) and a side surface 5b (the side surfaces of the base material 1, the intermediate layer 2, the oxide superconducting layer 3, the metal-stabilizing layer 4, and the foundation layer 7) of the laminate 5.

In detail, as shown in FIGS. 1 and 2A, the metal layer 6 has a main surface portion 6a, side surface portions 6b and 6b, and a rear surface portion 6c. The main surface portion 6a is provided on the main surface 4a side (on the main surface 4a) of the metal-stabilizing layer 4 and covers the main surface 4a. The side surface portion 6b is provided on the side surface 5b of the laminate 5 and covers the side surface 5b. The rear surface portion 6c is provided on the rear surface 5c of the laminate 5 (a front surface 7c of the foundation layer 7) and covers the rear surface 5c.

Examples of a metallic material constituting the metal layer 6 include copper, copper alloys, nickel, gold, silver, chromium, tin, and the like, and one of the above-described metallic materials or a combination of two or more metallic materials may be used. Examples of the copper alloys include Cu—Zn alloys, Cu—Ni alloys, and the like. Copper and copper alloys are highly conductive and inexpensive, which is preferable.

The metal layer 6 functions as a bypass for commutating currents in the oxide superconducting layer 3 together with the metal-stabilizing layer 4 when the oxide superconducting layer 3 is transited from a superconducting state to a normal conduction state.

As a metallic material constituting the metal layer 6, metal having a higher resistance than copper (high-resistance metal), for example, a Ni—Cr alloy may be used. When high-resistance metal is used, it becomes easy to reduce shielding currents, magnetization losses caused by the shielding currents, and alternating-current losses.

The thickness of the metal layer 6 can be, for example, 10 to 300 µm.

When the thickness of the metal layer 6 is in a range of 10 to 300 µm, pin holes are not easily generated, and thus the intrusion of moisture can be prevented, and furthermore, it is possible to improve flexibility by preventing an increase in the total thickness.

The metal layer 6 is a plate-coated layer formed by means of plating. The metal layer 6 can be formed by, for example, immersing the laminate 5 in a plating bath constituted of an aqueous solution of copper sulfate and carrying out electroplating.

Since the metal layer 6 is formed by means of plating, it is possible to ensure a sufficient thickness around the entire circumference of the laminate 5. Therefore, the metal layer 6 reliably covers the entire circumference of the laminate 5 and is capable of effectively preventing the oxide superconducting layer 3 from deteriorating due to moisture.

Furthermore, the oxide superconducting wire 8 may be fully covered with an insulating coating layer (not shown). When the oxide superconducting wire rod is coated with a coating layer, the oxide superconducting wire is fully protected, and the oxide superconducting wire 8 having stable performance can be obtained.

The coating layer may be a layer constituted of a well-known material such as a variety of resins or oxides which are generally used for the insulating coating of oxide superconducting wires and the like.

Specific examples of the resins include polyimide resins, polyamide resins, epoxy resins, acrylic resins, phenolic resins, melamine resins, polyester resins, silicon resins, silicon resins, alkyd resins, vinyl resins, and the like. In addition, ultraviolet-curable resins are preferred.

Examples of the oxides include $CeO_2$, $Y_2O_3$, $Gd_2Zr_2O_7$, $Gd_2O_3$, $ZrO_2$—$Y_2O_3$ (YSZ), $Zr_2O_3$, $Ho_2O_3$, and the like.

The thickness of a coating by the coating layer is not particularly limited and may be appropriately adjusted depending on coating subject portions and the like.

The coating layer may be formed using well-known methods depending on the material quality of the coating layer, and, for example, the coating layer may be formed by applying raw materials on the oxide superconducting wire 8 and curing the applied raw materials. In addition, in a case in which a sheet-like coating layer can be procured, the sheet-shaped coating layer may be used and laminated on the oxide superconducting wire 8.

In the oxide superconducting layer 3 in the oxide superconducting wire 8, a plurality of the non-orientation regions 3b extending in parallel at intervals is formed. The oxide superconducting layer 3 is fragmented by the non-orientation regions 3b, and the oxide superconducting wire 8 is divided into a plurality of the filaments 10. The respective filaments 10 are not mechanically fragmented, but the non-orientation regions 3b are formed in the oxide superconducting layer 3, and thus currents separately flow in the respective filaments 10 in a superconducting state. Due to the presence of the non-orientation regions 3b, the oxide superconducting wire 8 has a constitution in which individual superconducting wires (the filaments 10) are disposed in parallel.

When the number of the first recessed groove portions 1a (that is, the number of the non-orientation regions 2b and 3b formed on the first recessed groove portions 1a) is increased, the number of the filaments 10 to be formed in the oxide superconducting wire 8 increases, and alternating-current losses are reduced in inverse proportion to the number of the filaments 10. In addition, when the number of the filaments 10 is increased, shielding currents and magnetization losses caused by the shielding currents are reduced. Therefore, it is preferable to form an increased number of the first recessed groove portions 1a that are linearly formed. However, when the filaments are excessively thinned, the proportion of the non-orientation regions 3b in the oxide superconducting layer 3 increases, and the critical current density becomes low. In addition, in the oxide superconducting layer 3, there is a concern that the non-orientation regions 3b adjacent to each other may be connected to each other and currents may not flow in the longitudinal direction.

Therefore, the widths of the filaments 10 fragmented by the first recessed groove portions 1a in the base material 1 and the non-orientation regions 2b and 3b formed on the first recessed groove portions 1a are preferably 100 μm or more.

The widths of the respective filaments 10 may be identical to or different from each other, but, generally, are almost identical to each other.

As described above, when the oxide superconducting layer 3 is divided by the non-orientation regions 3b and is thus thinned, shielding currents in the oxide superconducting wire 8, magnetization losses caused by the shielding currents, and alternating-current losses are reduced.

In the oxide superconducting wire 8, the filament resistance per centimeter between a plurality of the filaments 10 obtained by dividing the oxide superconducting layer 3 using a plurality of the linear non-orientation regions 3b reaches 1 Ω/cm or more.

A plurality of the filaments 10 are electrically connected to each other using the metal-stabilizing layer 4 and the metal layer 6, but the metal-stabilizing layer 4 and the metal layer 6 do not have any superconducting characteristics and thus form a relatively high resistance during the use of the oxide superconducting wire 8, and currents do not easily flow. Therefore, there are no cases in which the division state of the oxide superconducting layer 3 is impaired.

The oxide superconducting wire 8 exhibits the following effects.

(1) The metal layer 6 is capable of functioning as a bypass for commutating currents in the oxide superconducting layer 3 together with the metal-stabilizing layer 4 when the oxide superconducting layer 3 is transited from the superconducting state to the normal conduction state. Therefore, even in a case in which a plurality of the filaments 10 formed by means of division are thin, in a case in which there are local defects, it is possible to limit the adverse influence of the local defects and prevent quenches.

(2) Since the metal layer 6 is formed, a decrease in the mechanical strength of the base material 1 caused by the first recessed groove portions 1a is complemented, and it is possible to increase the mechanical strength of the oxide superconducting wire 8.

(3) Since the formation of the metal layer 6 on the side surface 5b of the laminate 5 prevents the oxide superconducting layer 3 from being exposed, it is possible to prevent the oxide superconducting layer 3 from deteriorating due to moisture that has intruded from the outside.

(4) Since the metal layer 6 functions as a bypass for commutating currents in the oxide superconducting layer 3 together with the metal-stabilizing layer 4, it is possible to enhance the current-bypassing function and reliably prevent quenches regardless of the fact that the oxide superconducting wire 8 is divided into a plurality of the filaments 10.

As another embodiment, the metal-stabilizing layer 4 may have a constitution which is fragmented along the third recessed groove portions 3a. The above-described metal-stabilizing layer 4 can be formed by, for example, forming a mask on the metal-stabilizing layer 4, removing the mask in the portions corresponding to the third recessed groove portions 3a, and carrying out etching. In such a case, it is possible to remove the portions of the metal-stabilizing layer 4 which correspond to the third recessed groove portions 3a and laminate the metal-stabilizing layer 4 only on highly-oriented portions of the oxide superconducting layer 3.

In the above-described embodiment, the respective filaments 10 are not electrically connected to each other, and thus it is possible to more effectively reduce shielding currents, magnetization losses caused by the shielding currents, and alternating-current losses.

Next, an example of a method of manufacturing the oxide superconducting wire 8 according to the present embodiment will be described.

The method of manufacturing the oxide superconducting wire 8 according to the present embodiment includes a step of forming the first recessed groove portions 1a in the base material 1. Hereinafter, a specific manufacturing method will be described.

First, a tape-shaped base material 1 is prepared, and the main surface 1b of the tape-shaped base material 1 is polished, thereby setting the arithmetic average roughness Ra thereof to 3 nm to 4 nm. Furthermore, the main surface 1b of the base material is degreased and washed with acetone. After the above-described steps, the main surface of the base material 1 is prepared so as to easily provide an orientation of the intermediate layer 2 when the intermediate layer 2 is laminated on the base material 1.

Next, the linear first recessed groove portions 1a are formed on the main surface 1b of the tape-shaped base material 1.

Figure 3:
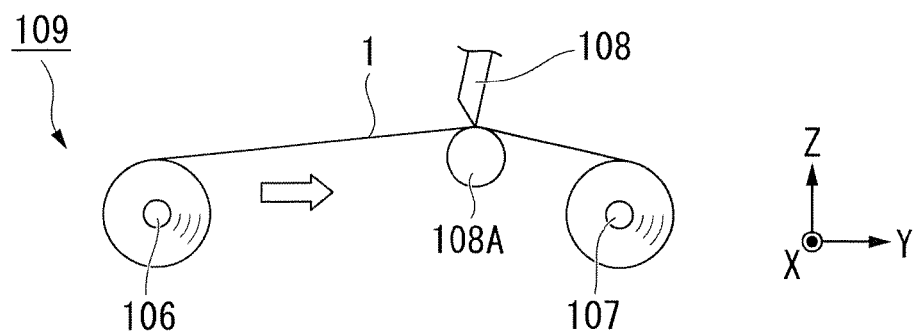
FIG. 3 is a schematic view of a first recessed groove portion-processing device according to a method of manufacturing the oxide superconducting wire according to the first embodiment.

FIG. 3 is a schematic view showing a first recessed groove portion-processing device 109 for forming the first recessed groove portions 1a on the main surface 1b of the base material 1 in the present embodiment.

The first recessed groove portion-processing device 109 is schematically constituted of a delivery reel 106, a coiling reel 107, a relay reel 108A disposed between the delivery reel 106 and the coiling reel 107, and a processing tool 108.

The base material 1 is coiled around the delivery reel 106. A transportation device such as a motor (not shown) is attached to the coiling reel 107. When one end of the base material 1 is coiled around the coiling reel 107, and the transportation device is operated, it is possible to deliver the base material 1 from the delivery reel 106 to the coiling reel 107 and coil the base material 1 using the coiling reel 107 through the relay reel 108A.

The processing tool 108 is a blade for metal processing in which the tip of the processing tool 108 faces the relay reel 108A. The tip of the processing tool 108 has, for example, a V-shape and a sharp shape.

When the tip of the processing tool 108 is pressed onto the base material 1 being transported along the outer circumference of the relay reel 108A while coiling the base material 1 around the coiling reel 107, it is possible to form linear grooves (the first recessed groove portions 1a, refer to FIG. 1) in the base material 1.

When a plurality of the processing tools 108 are disposed in parallel in the depth direction (X-axis direction) of FIG. 3, it is possible to form a plurality of the parallel first recessed groove portions 1a in the longitudinal direction of the tape-shaped base material 1.

As described above, the intermediate layer 2 is laminated on the oxide superconducting wire 8 having the first recessed groove portions 1a formed therein using a well-known method of the conventional art (lamination step). Furthermore, the oxide superconducting layer 3 is laminated on the main surface of the intermediate layer 2. In a film-forming step of the intermediate layer 2, the non-orientation regions 2b having no orientations are formed on the first recessed groove portions 1a. Similarly, in a film-forming step of the oxide superconducting layer 3, the non-orientation regions 3b in the oxide superconducting layer 3 are formed on the non-orientation regions 2b in the intermediate layer 2.

The metal-stabilizing layer 4 is laminated on the oxide superconducting layer 3. Next, the foundation layer 7 is faulted on the rear surface 1c of the base material 1 using a sputtering method or the like.

Therefore, it is possible to produce the laminate 5 thinned so as to have a plurality of the filaments 10 by the non-orientation regions 3b.

The metal layer 6 is formed on the outer circumference of the laminate 5. The metal layer 6 can be formed by, for example, immersing the laminate 5 in a plating bath constituted of an aqueous solution of copper sulfate and carrying out electroplating.

In the method of manufacturing the oxide superconducting wire 8 according to the present embodiment, since mechanical processing using laser or the like or chemical processing by means of etching is not added after the lamination of the oxide superconducting layer 3, there are no cases in which superconducting characteristics deteriorate in regions other than the orientation regions in the oxide superconducting layer 3. In addition, for the same reason, there are no cases in which the adhesiveness of the respective layers deteriorates.

<Modification Example of First Embodiment>

Figure 4A:
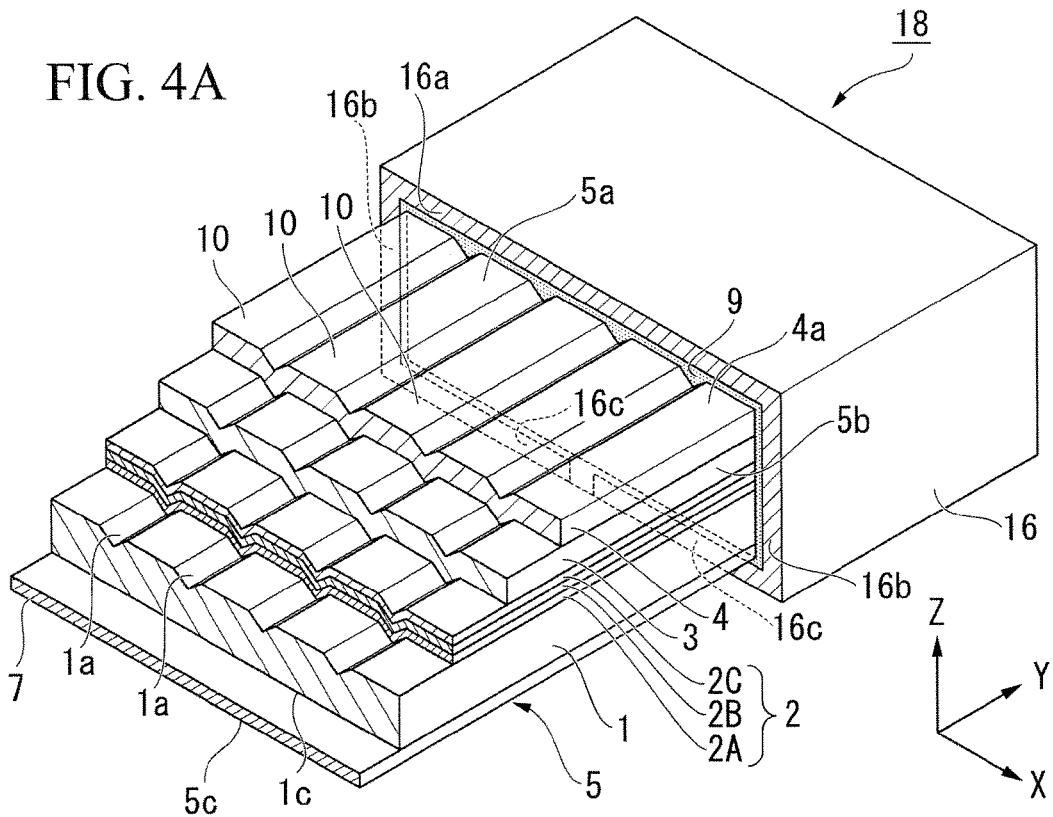
FIG. 4A is a sectional perspective view schematically showing a modification example of the oxide superconducting wire according to the first embodiment.
Figure 4B:
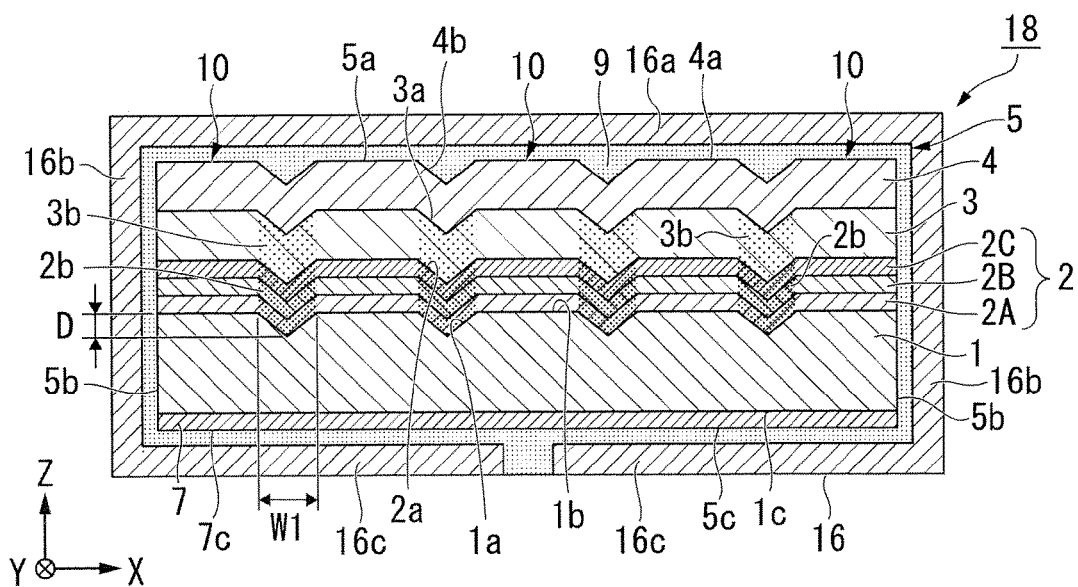
FIG. 4B is a sectional view schematically showing the modification example of the oxide superconducting wire according to the first embodiment.

FIGS. 4A and 4B show sectional views of an oxide superconducting wire 18 which is a modification example of the oxide superconducting wire 8 according to the first embodiment.

The oxide superconducting wire 18 is different from the oxide superconducting wire 8 shown in FIG. 1 in terms of the use of a metal layer 16 constituted of metal tape instead of the metal layer 6 formed by means of plating. Hereinafter, the same constitution as in the oxide superconducting wire 8 according to the first embodiment will be given the same reference number and will not be described.

The metal layer 16 is formed so as to cover at least the main surface 5a and the side surface 5b of the laminate 5.

In detail, as shown in FIG. 4B, the metal layer 16 has a main surface portion 16a, side surface portions 16b and 16b, and a rear surface portion 16c. The main surface portion 16a is provided on the main surface 4a side of the metal-stabilizing layer 4 and covers the main surface 4a. The side surface portion 16b is provided on the side surface 5b side of the laminate 5 and covers the side surface 5b. The rear surface portion 16c is provided on the rear surface 5c side of the laminate 5 and covers the rear surface 5c.

Examples of a metallic material constituting the metal layer 16 include copper, copper alloys, aluminum, aluminum alloys, stainless steel, and the like, and one of the above-described metallic materials or a combination of two or more metallic materials may be used. Examples of the copper alloys include Cu—Zn alloys, Cu—Ni alloys, and the like. Copper and copper alloys are highly conductive and inexpensive, which is preferable.

The metal layer 16 functions as a bypass for commutating currents in the oxide superconducting layer 3 together with the metal-stabilizing layer 4 when the oxide superconducting layer 3 is transited from a superconducting state to a normal conduction state.

As a metallic material constituting the metal layer 16, metal having a higher resistance than copper (high-resistance metal), for example, a Ni—Cr alloy may be used. When high-resistance metal is used, it becomes easy to reduce shielding currents, magnetization losses caused by the shielding currents, and alternating-current losses.

The thickness of the metal layer 16 can be, for example, 10 to 300 μm.

When the thickness of the metal layer 16 is in a range of 10 to 300 μm, pin holes are not easily generated, and thus the intrusion of moisture into the oxide superconducting wire 18 can be prevented, and furthermore, it is possible to improve flexibility by preventing an increase in the total thickness of the oxide superconducting wire 18.

The metal layer 16 is joined to the surfaces (the main surface 5a, the side surface 5b, and the rear surface 5c) of the laminate 5 with a solder layer 9 interposed therebetween.

The metal layer 16 can be formed, for example, in the following manner. After a solder layer is formed on the surface of the laminate 5 by means of plating, metal tape is disposed on the solder layer, and the metal tape is bent so as to form a C-shaped horizontal section and enclose the laminate 5. The solder layer is heated and fused, and the metal tape is joined to the laminate 5 through the solder layer. Therefore, the metal layer 16 joined to the laminate 5 with the solder layer 9 interposed therebetween is obtained.

Since the metal layer 16 is formed using metal tape, it is possible to ensure a sufficient thickness around the entire circumference of the laminate 5. Therefore, the metal layer reliably covers the entire circumference of the laminate 5 and is capable of effectively preventing the oxide superconducting layer 3 from deteriorating due to moisture.

<Second Embodiment>

Next, a second embodiment will be described.

Figure 5A:
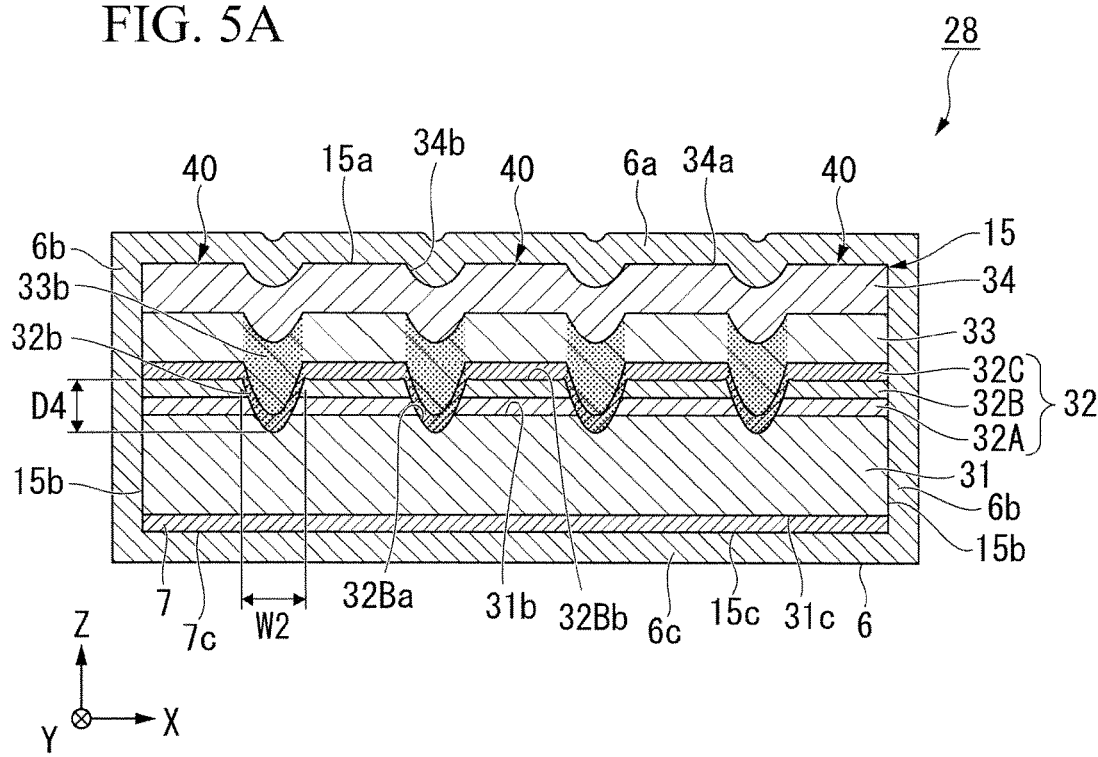
FIG. 5A is a sectional view schematically showing an oxide superconducting wire according to a second embodiment.
Figure 5B:
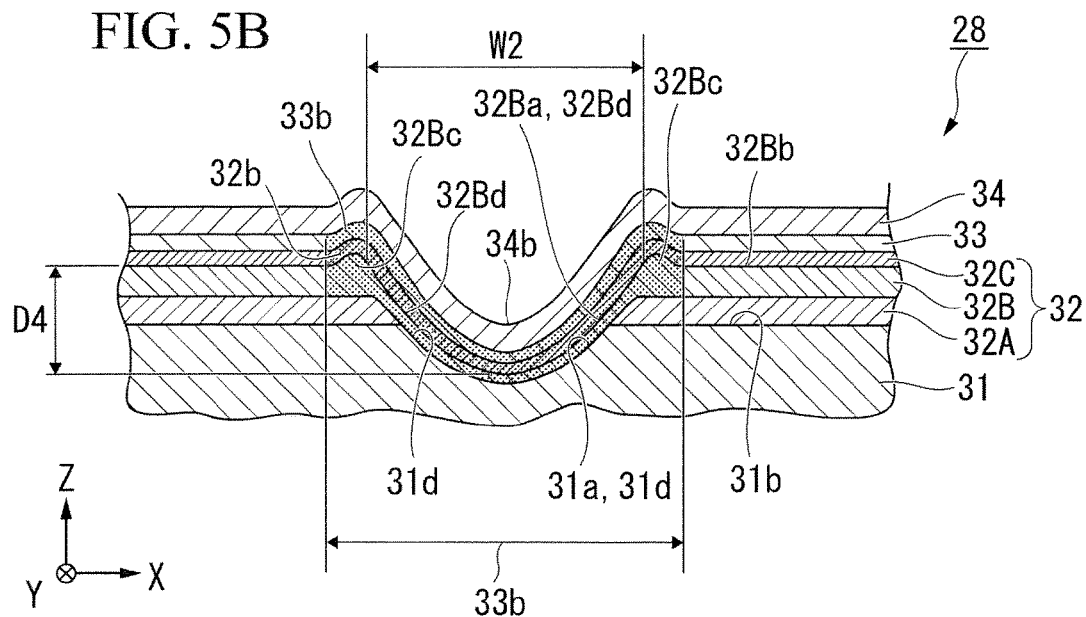
FIG. 5B is a sectional enlarged view schematically showing the oxide superconducting wire according to the second embodiment.

FIG. 5A shows a sectional view of an oxide superconducting wire 28 according to the second embodiment. In addition, FIG. 5B is an enlarged view of a non-orientation region 33b in an oxide superconducting layer 33. Hereinafter, the oxide superconducting wire 28 will be described on the basis of FIGS. 5A and 5B.

The oxide superconducting wire 28 according to the second embodiment is different from the oxide superconducting wire 8 according to the first embodiment in terms of the constitution of a recessed groove portion 32Ba. Hereinafter, the same constitution as in the oxide superconducting wires 8 and 18 which are the first embodiment and the modification example of the first embodiment will be given the same reference number and will not be described.

As shown in FIGS. 5A and 5B, the oxide superconducting wire 28 includes a laminate 15 and the metal layer 6 formed on the outer circumference of the laminate 15.

The laminate 15 is constituted by laminating an intermediate layer 32 (a foundation layer 32A, a textured layer 32B, and a cap layer 32C), an oxide superconducting layer 33, and a metal-stabilizing layer 34 in this order on a main surface 31$b$ (first surface) of a base material 31 and forming the foundation layer 7 on a rear surface 31$c$ (second surface) of the base material 31. In other words, in the laminate 15, the base material 31 is formed on the foundation layer 7, the intermediate layer 32 is formed on the base material 31, the oxide superconducting layer 33 is formed on the intermediate layer 32, and the metal-stabilizing layer 34 is forming on the oxide superconducting layer 33.

The base material 31 is capable of employing the same constitution as that of the base material 1 in the oxide superconducting wire 8 according to the first embodiment.

Similar to the foundation layer 2A in the oxide superconducting wire 8 according to the first embodiment, the foundation layer 32A is constituted of at least one of a diffusion prevention layer and a bed layer. The foundation layer 32A is capable of employing the same constitution as that of the foundation layer 2A.

The foundation layer 32A in portions in which the recessed groove portion 32Ba is formed may be discontinuous in the width direction (X direction). That is, the foundation layer 32A may be fragmented in the width direction (X direction).

Similar to the textured layer 2B in the oxide superconducting wire 8 according to the first embodiment, the textured layer 32B is provided in order to control the crystal orientation of the cap layer 32C or the oxide superconducting layer 33 which is formed on the textured layer 32B.

On a main surface 32Bb of the textured layer 32B, a plurality of recessed groove portions 32Ba reaching the base material 31 is formed. The recessed groove portions 32Ba linearly extend in the longitudinal direction of the base material 31. A plurality of the recessed groove portions 32Ba are formed in parallel to each other at intervals. The recessed groove portions 32Ba can be formed by pressing a processing tool onto the main surface 32Bb of the textured layer 32B so as to move the base material 31. A method of foil ring the recessed groove portions 32Ba is the same as the method of forming the first recessed groove portions 1$a$ according to the first embodiment.

As shown in FIG. 5B, the sectional shape of the recessed groove portion 32Ba is, for example, a substantial arc shape. The recessed groove portion 32Ba has a pair of facing inside surfaces 32Bd and 32Bd. At least part of the inside surfaces 32Bd and 32Bd are inclined inside with respect to the Z direction (the thickness direction of the oxide superconducting wire 28) in the groove depth direction. The inside mentioned herein refers to a direction in which one inside surface (a first inside surface) 32Bd comes closer to the other inside surface (a second inside surface) 32Bd.

In portions in which the recessed groove portion 32Ba is formed, the textured layer 32B has a shape curved into an arc sectional shape.

When the recessed groove portions 32Ba are formed, the orientations in portions of the textured layer 32B right below the recessed groove portions 32Ba and around the recessed groove portions 32Ba are disarrayed, and non-orientation regions are formed in the textured layer 32B. As shown in FIG. 5B in an enlarged manner, at the edge portion of the recessed groove portion 32Ba, a protruded portion 32Bc formed of the protruded textured layer 32B is formed. When the recessed groove portion 32Ba is formed by pressing a processing tool onto the textured layer 32B, some of the textured layer 32B, the foundation layer 32A, and the base material 31 which are pressed by the processing tool are pushed outside the recessed groove portion 32Ba and are protruded, whereby the protruded portion 32Bc is formed. Therefore, the textured layer 32B does not have any orientations in the recessed groove portion 32Ba and the protruded portion 32Bc. That is, regions in which the recessed groove portion 32Ba and the protruded portion 32Bc are formed function as non-orientation regions. In addition, the recessed groove portion 32Ba and the protruded portion 32Bc function as orientation inhibition regions that inhibit the orientation of the oxide superconducting layer 33 to be laminated on the recessed groove portion 32Ba and the protruded portion 32Bc.

The widths W2 of the recessed groove portions 32Ba are preferably 0.3 µM or more and 40 µm or less.

When the widths W2 of the recessed groove portions 32Ba are 0.3 µm or more, it is possible to reliably form the non-orientation regions 33$b$ in the oxide superconducting layer 33. In addition, when the widths W2 of the recessed groove portions 32Ba are 40 µm or less, it is possible to narrow the widths of the non-orientation regions 33$b$ in the oxide superconducting layer 33 and ensure the critical current density.

In the present specification, the recessed groove portion 32Ba refers to a region in which the textured layer 32B is recessed and thus becomes thinner than the formed film thickness. Therefore, the protruded portion 32Bc is not included in the recessed groove portion 32Ba and is a region formed on both sides of the recessed groove portion 32Ba. The width W2 of the recessed groove portion 32Ba is the width of the recessed portion of the textured layer 32B which does not includes the protruded portion 32Bc. The depth D4 of the recessed groove portion 32Ba refers to a distance in the depth direction from the main surface 32Bb of the textured layer 32B to the deepest portion of the recessed groove portion 32Ba.

The depths D4 of the recessed groove portions 32Ba are preferably 0.3 µm or more and 10 µm or less.

When the depths D4 of the recessed groove portions 32Ba are 0.3 µm or more, it is possible to reliably form the non-orientation regions 33$b$ in the oxide superconducting layer 33. In addition, when the depths D4 of the recessed groove portion 32Ba are 10 µm or less, it is possible to maintain the strength of the base material 31.

Regarding other constitutions, the textured layer 32B is capable of employing the same constitution as that of the textured layer 2B in the oxide superconducting wire 8.

The sectional shape of the recessed groove portions 32Ba is not limited to a substantial arc shape shown in FIGS. 5A and 5B and may be, for example, a V-shaped groove.

As shown in FIG. 5B, on the main surface 31$b$ of the base material 31, the first recessed groove portions 31$a$ having an arc sectional shape corresponding to the shape of the recessed groove portion 32Ba are formed at locations corresponding to the recessed groove portions 32Ba.

The first recessed groove portion 31$a$ has a pair of facing inside surfaces 31$d$ and 31$d$. At least part of the inside surfaces 31$d$ and 31$d$ are inclined inside with respect to the Z direction (the thickness direction of the oxide superconducting wire 28) in the groove depth direction. The inside mentioned herein refers to a direction in which one inside surface (a first inside surface) 31d comes closer to the other inside surface (a second inside surface) 31d.

Regarding other constitutions, the base material 31 is capable of employing the same constitution as that of the base material 1 in the oxide superconducting wire 8.

The sectional shape of the first recessed groove portions 31a is not limited to a substantial arc shape and may be, for example, a V-shaped groove.

The textured layer 32B in portions in which the recessed groove portion 32Ba is formed may be continuously formed in the width direction (X direction) of the recessed groove portion 32Ba, but may also be discontinuous in the direction (X direction) of the recessed groove portion 32Ba. That is, the textured layer 32B may be fragmented in the width direction (X direction) in the first recessed groove portions 31a. In addition, the textured layer 32B may not be formed in the first recessed groove portions 31a.

In the cap layer 32C, portions laminated on the recessed groove portions 32Ba and the protruded portions 32Bc of the textured layer 32B do not have any orientations. The intermediate layer 32 has non-orientation regions 32b as a whole. In addition, the non-orientation region 32b refers to a region corresponding to the recessed groove portion 32Ba and the region 32Bc located at the edge portion of the recessed groove portion 32Ba.

The cap layer 32C in portions in which the recessed groove portion 32Ba is formed has a shape curved into an arc sectional shape corresponding to the shape of the recessed groove portion 32Ba. The cap layer 32C in portions in which the recessed groove portion 32Ba is formed is not fragmented in the width direction (X direction) of the recessed groove portion 32Ba and is continuously formed in the width direction of the recessed groove portion 32Ba.

Regarding other constitutions, the cap layer 32C is capable of employing the same constitution as that of the cap layer 2C in the oxide superconducting wire 8.

Since the orientation of the oxide superconducting layer 33 is controlled by the intermediate layer 32 (particularly, the textured layer 32B and the cap layer 32C), portions formed on the non-orientation regions 32b in the intermediate layer 32 are not capable of having orientations. In the oxide superconducting layer 33, the portions formed on the non-orientation region 32b in the intermediate layer 32 serve as the non-orientation regions 33b having no orientations.

The oxide superconducting layer 33 in portions in which the recessed groove portion 32Ba is formed has a shape curved into an arc sectional shape which corresponds to the shape of the recessed groove portion 32Ba. The oxide superconducting layer 33 in portions in which the recessed groove portion 32Ba is formed is not fragmented in the width direction (X direction) of the recessed groove portion 32Ba and is continuously formed in the width direction of the recessed groove portion 32Ba.

Regarding other constitutions, the oxide superconducting layer 33 is capable of employing the same constitution as that of the oxide superconducting layer 3 in the oxide superconducting wire 8.

The metal-stabilizing layer 34 in portions in which the recessed groove portion 32Ba is formed has a shape curved into an arc sectional shape which corresponds to the shape of the recessed groove portion 32Ba. The metal-stabilizing layer 34 in portions in which the recessed groove portion 32Ba is formed is not fragmented in the width direction (X direction) of the recessed groove portion 32Ba and is continuously formed in the width direction of the recessed groove portion 32Ba.

On the surface (main surface 34a) of the metal-stabilizing layer (protective layer) 34, fourth recessed groove portions 34b having an arc sectional shape corresponding to the shape of the recessed groove portion 32Ba are formed as if the recessed groove portions 32Ba in the textured layer 32B are transferred.

The main surface 34a is a surface on the oxide superconducting layer 33 side among the surfaces of the laminate 15.

Regarding other constitutions, the metal-stabilizing layer 34 is capable of employing the same constitution as that of the metal-stabilizing layer 4 in the oxide superconducting wire 8.

As shown in FIG. 5A, the metal layer 6 is a plate-coated layer formed by means of plating and is formed so as to cover at least a main surface 15a (the main surface 34a of the metal-stabilizing layer 34) and a side surface 15b (the side surfaces of the base material 31, the intermediate layer 32, the oxide superconducting layer 33, the metal-stabilizing layer 34, and the foundation layer 7) of the laminate 15.

The main surface portion 6a of the metal layer 6 is provided on the main surface 34a side of the metal-stabilizing layer 34 and covers the main surface 34a. The side surface portion 6b is provided on the side surface 15b of the laminate 15 and covers the side surface 15b. The rear surface portion 6c is provided on the rear surface 15c of the laminate 15 (the front surface 7c of the foundation layer 7) and covers the rear surface 15c.

Since the metal layer 6 is formed by means of plating, it is possible to ensure a sufficient thickness around the entire circumference of the laminate 15. Therefore, the metal layer reliably covers the entire circumference of the laminate 15 and is capable of effectively preventing the oxide superconducting layer 33 from deteriorating due to moisture.

In the oxide superconducting wire 28 according to the second embodiment, the oxide superconducting layer 33 is substantially fragmented by the non-orientation region 33b. Due to the presence of the non-orientation regions 33b, the oxide superconducting wire 28 has a constitution which is divided into a plurality of filaments 40 and being disposed in parallel. As described above, when the oxide superconducting layer 33 is divided by the non-orientation regions 33b and is thinned, shielding currents in the oxide superconducting wire 28, magnetization losses caused by the shielding currents, and alternating-current losses are reduced.

In addition, in the oxide superconducting wire 28 according to the second embodiment, the recessed groove portions 32Ba are formed by directly processing part of the intermediate layer 32 that controls the orientation of the oxide superconducting layer 33. Due to the presence of the recessed groove portions 32Ba, it is possible to more reliably form the non-orientation regions 32b in the intermediate layer 32.

In the oxide superconducting wire 28 according to the present embodiment, since mechanical processing using laser or the like or chemical processing by means of etching is not added after the lamination of the oxide superconducting layer 33, there are no cases in which superconducting characteristics deteriorate in regions other than the orientation regions in the oxide superconducting layer 33. In addition, there are no cases in which the adhesiveness between the respective layers deteriorates.

It is known that the ordinarily-laminated oxide superconducting layer 33 has weak adhesiveness to layers below. In the oxide superconducting wire 28 according to the present embodiment, it is possible to enhance the adhesiveness between the oxide superconducting layer 33 and the intermediate layer 32 provided under the oxide superconducting layer 33. That is, it is possible to suppress the peeling of the oxide superconducting layer 33. The recessed groove portions 32Ba in the textured layer 32B are formed by pressing a processing tool onto the main surface 32Bb of the textured layer 32B, and fine protrusions and recesses caused by the processing are formed on the surface. In the cap layer 32C formed on the recessed groove portions 32Ba having protrusions and recesses, fine protrusions and recesses are formed on the surface in accordance with the fine protrusions and recesses formed on the textured layer 32B. When the oxide superconducting layer 33 is formed on the cap layer 32C, the joint strength between the cap layer 32C and the oxide superconducting layer 33 becomes great due to an anchoring effect of the fine protrusions and recesses, and thus the adhesiveness between the cap layer 32C and the oxide superconducting layer 33 enhances. It is considered that the oxide superconducting layer 33 does not easily peel off from the cap layer 32C due to the fine protrusions and recesses on the cap layer 32C.

Similar to the oxide superconducting wire 8 according to the first embodiment, the oxide superconducting wire 28 exhibits the following effects.

(1) Since the metal layer 6 functions as a bypass for commutating currents in the oxide superconducting layer 33 together with the metal-stabilizing layer 34, in a case in which there are local defects, it is possible to limit the adverse influence of the local defects and prevent quenches.

(2) The metal layer 6 complements a decrease in the strength of the base material 31 caused by the first recessed groove portions 31a and is capable of increasing the mechanical strength of the oxide superconducting wire 28.

(3) Since the metal layer 6 prevents the oxide superconducting layer 33 from being exposed, it is possible to prevent the oxide superconducting layer 33 from deteriorating due to moisture.

(4) Since the metal layer 6 functions as a bypass for commutating currents in the oxide superconducting layer 3 together with the metal-stabilizing layer 34, it is possible to enhance the current-bypassing function and reliably prevent quenches.

In the present embodiment, a constitution in which the recessed groove portions 32Ba are formed in the textured layer 32B in the intermediate layer 32 has been exemplified. The recessed groove portions formed in the intermediate layer 32 may be formed on the main surface of any one layer in the intermediate layer 32. In such a case, the recessed groove portions are capable of constituting the non-orientation regions 32b in the intermediate layer 32. That is, the non-orientation regions 32b in the intermediate layer 32 need to be regions in which the orientation is disarrayed due to the recessed groove portion formed on any one layer in the intermediate layer 32.

In addition, as exemplified in the present embodiment, when the recessed groove portions 32Ba are formed in the textured layer 32B, the recessed groove portions 32Ba are covered with the cap layer 32C formed on the textured layer 32B. In a case in which the recessed groove portions 32Ba are formed in the textured layer 32B, the textured layer 32B and the respective layers in the intermediate layer below the textured layer 32B become thin in portions of the recessed groove portions 32Ba or the textured layer 32B is partially removed, the base material 31 is exposed, and thus it becomes easy for elements of the base material 31 to diffuse into the oxide superconducting layer 33. When the cap layer 32C is formed in the recessed groove portions 32Ba, there are no cases in which the base material 31 and the oxide superconducting layer 33 come into direct contact with each other in the region of the recessed groove portion 32Ba. The formation of the cap layer 32C enables to limit the diffusion of the metallic material of the base material 31 into the oxide superconducting layer 33. Therefore, it is preferable to employ a structure in which the recessed groove portions 32Ba are formed in the textured layer 32B and the recessed groove portions 32Ba are covered with the cap layer 32C.

<Modification Example of Second Embodiment>

Figure 6:
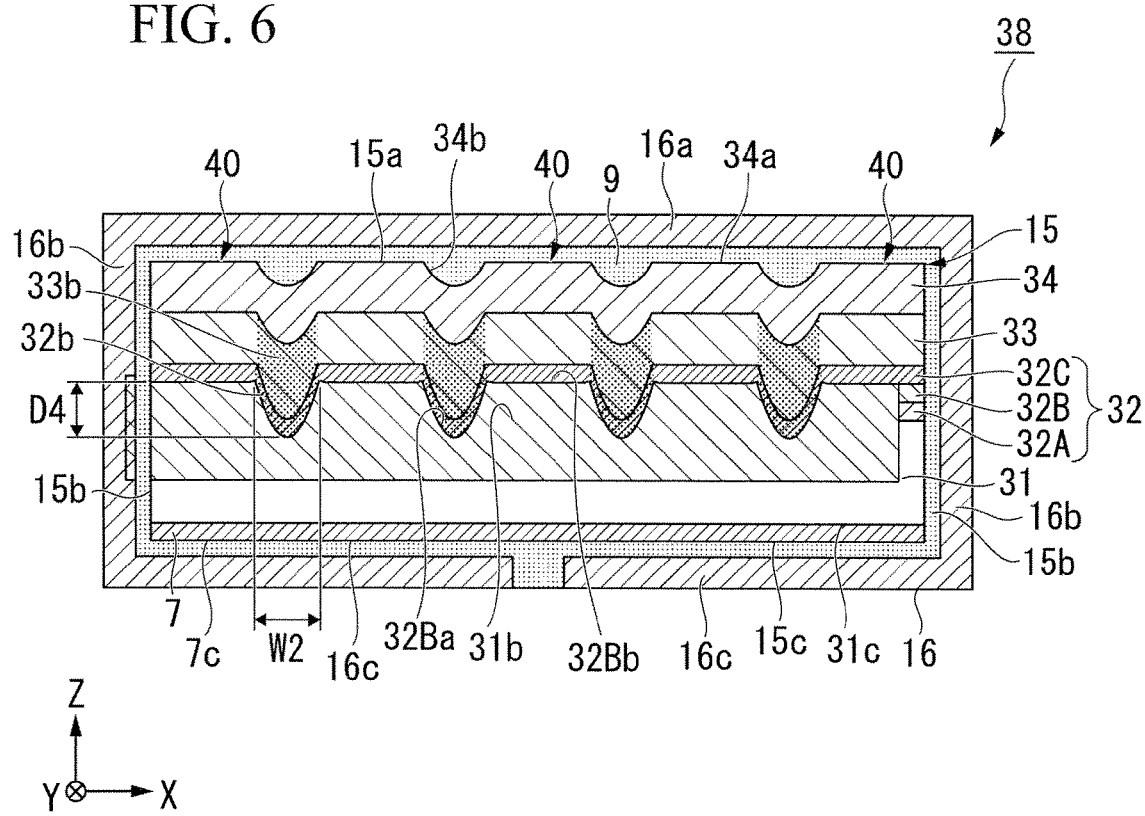
FIG. 6 is a sectional view schematically showing a modification example of the oxide superconducting wire according to the second embodiment.

FIG. 6 shows a sectional view of an oxide superconducting wire 38 which is a modification example of the oxide superconducting wire 28 according to the second embodiment. Hereinafter, the same constitution as in the oxide superconducting wire 28 according to the second embodiment will be given the same reference number and will not be described.

The oxide superconducting wire 38 is different from the oxide superconducting wire 28 shown in FIGS. 5A and 5B in terms of the use of the metal layer 16 constituted of metal tape instead of the metal layer 6 formed by means of plating.

As shown in FIG. 6, the metal layer 16 is formed so as to cover at least the main surface 15a and the side surface 15b of the laminate 15.

The main surface portion 16a of the metal layer 16 is provided on the main surface 34a side of the metal-stabilizing layer 34 and covers the main surface 34a. The side surface portion 16b is provided on the side surface 15b side of the laminate 15 and covers the side surface 15b. The rear surface portion 16c is provided on the rear surface 15c side of the laminate 15 and covers the rear surface 15c.

The metal layer 16 is joined to the surfaces (the main surface 15a, the side surface 15b, and the rear surface 15c) of the laminate 5 with the solder layer 9 interposed therebetween.

The metal layer 16 can be formed, for example, in the following manner. After a solder layer is formed on the surface of the laminate 15 by means of plating, metal tape is disposed on the solder layer, and the metal tape is bent so as to form a C-shaped horizontal section and enclose the laminate 15. The solder layer is heated and fused, and the metal tape is joined to the laminate 15 through the solder layer. Therefore, the metal layer 16 joined to the laminate 15 with the solder layer 9 interposed therebetween is obtained.

Since the metal layer 16 is formed using metal tape, it is possible to ensure a sufficient thickness around the entire circumference of the laminate 15. Therefore, the metal layer reliably covers the entire circumference of the laminate 15 and is capable of effectively preventing the oxide superconducting layer 3 from deteriorating due to moisture.

EXAMPLES

Hereinafter, the present invention will be described in more detail using examples, but the present invention is not limited to these examples.

<Production of Samples>

<Sample No. 1>

First, the main surface of a tape-shaped base material which was constituted of HASTELLOY C-276 (trade name, manufactured by Haynes International, Inc.) and had a width of 4 mm, a thickness of 0.075 mm, and a length of 1000 mm was polished using alumina having an average particle diameter of 3 μm. Next, the surface of the base material was degreased and washed with acetone.

An $Al_2O_3$ film (a diffusion prevention layer; a film thickness of 100 nm) was formed on the washed main surface of the base material using a sputtering method, and a $Y_2O_3$ film (a bed layer; a film thickness of 30 nm) was formed on the formed $Al_2O_3$ film using an ion beam sputtering method.

Next, a MgO film (a textured layer; a film thickness of 5 to 10 nm) was formed on the bed layer using an ion-beam-assisted deposition method (IBAD method), and a 500 nm-thick $CeO_2$ film (a cap layer) was formed on the formed MgO film using a pulsed laser deposition method (PLD method). Next, a 2.0 μm-thick $GdBa_2Cu_3O_{7-x}$ layer (an oxide superconducting layer) was formed on the $CeO_2$ layer using the PLD method. A metal-stabilizing layer (a film thickness of 2 μm) constituted of Ag was formed on the oxide superconducting layer using a sputtering method, and furthermore, the layer was subjected to oxygen annealing at 500° C. for ten hours, was cooled in a furnace for 26 hours, and then was taken out.

Through the above-described sequence, an oxide superconducting wire of Sample No. 1 was obtained.

<Sample No. 2>

In the production sequence of the oxide superconducting wire of Sample No. 1, after a laminate structure (the base material, the diffusion prevention layer, the bed layer, and the textured layer) was obtained by forming an MgO layer (a textured layer; a film thickness of 5 to 10 nm), first recessed groove portions (recessed groove portions) extending in the longitudinal direction of the base material were formed on the surface of the laminate structure using the first recessed groove portion-processing device shown in FIG. 3.

As the processing tool, a 100 μm-thick blade was used. The blade was pressed onto the laminate structure which is being transported between the delivery reel and the coiling reel, thereby forming flaws (first recessed groove portions having a V-shaped section) extending in the longitudinal direction. The oxide superconducting layer and the like in the laminate structure were divided into four fragments in the width direction due to the flaws. The flaw had a width of approximately 20 μm and a depth of approximately 10 μM.

Next, similar to Sample No. 1, a $CeO_2$ layer (a cap layer), a $GdBa_2Cu_3O_{7-x}$ layer (an oxide superconducting layer), and a metal-stabilizing layer were formed on the MgO layer, and oxygen annealing was carried out.

Through the above-described sequence, an oxide superconducting wire of Sample No. 2 was obtained.

<Sample No. 3>

The same oxide superconducting wire as the oxide superconducting wire of Sample No. 1 was produced, and a foundation layer (a film thickness of 1 μm) constituted of Cu was formed on the rear surface of the base material by means of sputtering, thereby obtaining a laminate.

A metal layer (a film thickness of 20 μm) constituted of Cu was formed on the outer circumference of the laminate by means of electroplating so as to cover the entire circumference of the laminate.

Through the above-described sequence, an oxide superconducting wire of Sample No. 3 was obtained.

<Sample No. 4>

The same oxide superconducting wire as the oxide superconducting wire of Sample No. 2 was produced, and a foundation layer (a film thickness of 1 μm) constituted of Cu was formed on the rear surface of a base material by means of sputtering, thereby obtaining a laminate.

A metal layer (a film thickness of 20 μm) constituted of Cu was formed on the outer circumference of the laminate by means of electroplating so as to cover the entire circumference of the laminate.

Through the above-described sequence, an oxide superconducting wire of Sample No. 4 was obtained.

<Sample No. 5>

The same oxide superconducting wire as the oxide superconducting wire of Sample No. 1 was produced, and a foundation layer (a film thickness of 1 μm) constituted of Cu was formed on the rear surface of a base material by means of sputtering, thereby obtaining a laminate.

A metal layer (a film thickness of 20 μm) constituted of Cu was formed on the outer circumference of the laminate by means of electroplating so as to cover the entire circumference of the laminate, thereby obtaining an oxide superconducting wire.

In the oxide superconducting wire, gaps extending in the longitudinal direction of the wire were formed on the surface of the main surface portion of the metal layer using polyimide tape, thereby carrying out masking. Next, the metal layer, the metal-stabilizing layer, and the oxide superconducting layer were etched using nitric acid so as to form grooves, whereby the oxide superconducting wire was divided in the width direction, and thus an oxide superconducting wire divided into four filaments (having a width of approximately 1 mm) was obtained.

Through the above-described sequence, an oxide superconducting wire of Sample No. 5 was obtained.

<Evaluations>

<Tensile Strength>

The tensile strengths of the oxide superconducting wires of Sample Nos. 1 to 4 were measured.

The tensile strength was measured in liquid nitrogen, and an Ic irreversible stress (a stress at which the ratio ($Ic_1/Ic_0$) of the critical current density value $Ic_1$ after tension to the critical current density value $Ic_0$ before tension reached less than 0.99) was obtained.

For Sample Nos. 3 and 4 which were metal layers, the ratio between the tensile strengths (Sample No. 4/Sample No. 3) was obtained. Similarly, for Sample Nos. 1 and 2 which were not metal layers, the ratio between the tensile strengths (Sample No. 2/Sample No. 1) was obtained. The results are shown in Table 1.

TABLE 1

|  | Ratio between tensile strengths |
| --- | --- |
| With metal layer (Sample No. 4/Sample No. 3) | 0.98 |
| Without metal layer (Sample No. 2/Sample No. 1) | 0.87 |

As shown in Table 1, the influences of the thinning of the wire on the tensile strength of the wire were evaluated on the basis of the ratios between the tensile strengths.

It was found that, in a case in which there was the metal layer, the difference in tensile strength between two samples was small, and thus the strength did not easily decrease even when the wire was thinned.

In contrast, it was found that, in a case in which there was no metal layer, when the wire was thinned, the strength decreased.

<Presence or Absence of Deterioration Due to Moisture>

For the oxide superconducting wires of Sample Nos. 4 and 5, tests were carried out in the following order.

(1) The critical currents $Ic_0$ of the samples were measured using the four-terminal method.

(2) The samples were immersed in pure water for one hour.

(3) For the samples removed from the pure water, the critical current density values $Ic_1$ were measured using the four-terminal method.

For the respective samples, $Ic_1/Ic_0$'s were obtained. The results are shown in Table 2.

TABLE 2

|  | $Ic_1/Ic_0$ |
|---|---|
| Sample No. 4 | 0.99 |
| Sample No. 5 | 0.74 |

From Table 2, it is found that, in Sample No. 4 in which the metal layer was formed, the $Ic_1/Ic_0$ was high and the oxide superconducting layer was not easily deteriorated due to moisture.

For example, in the above-described embodiments, cases in which the orientation inhibition regions are formed in a specific layer have been exemplified. However, the layers in which the orientation inhibition regions are formed may be the base material or any layers in the intermediate layer. That is, the orientation inhibition regions may be formed in any layers as long as the layers are formed below the oxide superconducting layer.

In FIG. 1 and the like, the oxide superconducting wire 8 is divided into a plurality of the filaments 10 due to a plurality of the first recessed groove portions 1a, but only one recessed groove portion may be provided. In a case in which only one recessed groove portion is provided, the oxide superconducting wire is divided into two filaments.

The oxide superconducting wires 8, 18, 28, and 38 shown in FIG. 1 and the like have the foundation layer 7, but the oxide superconducting wire of the present invention may not have any foundation layers.

DESCRIPTION OF REFERENCE NUMERAL 1, 31 . . . base material
1a, 32Ba . . . (first) recessed groove portion (orientation inhibition region)
1b, 31b . . . main surface
2, 32 . . . intermediate layer
2A, 32A . . . foundation layer
2B, 32B . . . textured layer
2C, 32C . . . cap layer
2b, 3b, 32b, 33b . . . non-orientation region
3, 33 . . . oxide superconducting layer
4, 34 . . . metal-stabilizing layer
5, 15 . . . laminate
6, 16 . . . metal layer
8, 18, 28, 38 . . . oxide superconducting wire
10, 40 . . . filament

The invention claimed is:

1. An oxide superconducting wire, comprising:
a laminate comprising a base material, an intermediate layer, and an oxide superconducting layer, the intermediate layer being laminated on a main surface of the base material, the intermediate layer being constituted of one or more layers having an orientation, the intermediate layer having one or more first non-orientation regions extending in a longitudinal direction of the base material, the oxide superconducting layer being laminated on the intermediate layer, the oxide superconducting layer having a crystal orientation controlled by the intermediate layer, the oxide superconducting layer having second non-orientation regions located on the first non-orientation regions; and
a metal layer which covers at least a front surface and side surfaces of the oxide superconducting layer in the laminate.

2. The oxide superconducting wire according to claim 1, wherein the main surface of the base material or a main surface of any one layer in the intermediate layer has orientation inhibition regions, and the orientation inhibition regions are regions that inhibit crystal orientations in layers laminated on the orientation inhibition regions and form the first non-orientation regions and the second non-orientation regions.

3. The oxide superconducting wire according to claim 2, wherein the orientation inhibition regions are recessed groove portions formed on the main surface of the base material or the main surface of any one layer in the intermediate layer.

4. The oxide superconducting wire according to claim 3, wherein the intermediate layer comprises a textured layer and a cap layer laminated on the textured layer, the oxide superconducting layer is laminated on the cap layer, and the recessed groove portions are covered with the cap layer.

5. The oxide superconducting wire according to claim 1, wherein the laminate has a metal-stabilizing layer laminated on the oxide superconducting layer, and the metal layer is formed so as to cover the metal-stabilizing layer.

6. The oxide superconducting wire according to claim 2, wherein the laminate has a metal-stabilizing layer laminated on the oxide superconducting layer, and the metal layer is formed so as to cover the metal-stabilizing layer.

7. The oxide superconducting wire according to claim 3, wherein the laminate has a metal-stabilizing layer laminated on the oxide superconducting layer, and the metal layer is formed so as to cover the metal-stabilizing layer.

8. The oxide superconducting wire according to claim 4, wherein the laminate has a metal-stabilizing layer laminated on the oxide superconducting layer, and the metal layer is formed so as to cover the metal-stabilizing layer.

* * * * *